United States Patent [19]
Pfiester et al.

[11] Patent Number: 5,010,030
[45] Date of Patent: Apr. 23, 1991

[54] SEMICONDUCTOR PROCESS USING SELECTIVE DEPOSITION

[75] Inventors: James R. Pfiester; James D. Hayden, both of Austin, Tex.

[73] Assignee: Motorola, Inc., Schaumburg, Ill.

[21] Appl. No.: 428,721

[22] Filed: Oct. 30, 1989

[51] Int. Cl.$^5$ .................................... H01L 21/265
[52] U.S. Cl. ............................... 437/192; 437/28; 437/34; 437/40; 437/58; 437/913; 148/DIG. 9; 148/DIG. 82; 148/DIG. 105
[58] Field of Search ............... 437/192, 34, 56, 57, 437/913, 40, 58; 148/DIG. 9, DIG. 82, DIG. 105, DIG. 106

[56] References Cited

U.S. PATENT DOCUMENTS

| | | | |
|---|---|---|---|
| 4,528,744 | 7/1985 | Shibata | 437/34 |
| 4,717,683 | 1/1988 | Parrillo et al. | 437/57 |
| 4,843,023 | 6/1989 | Chiu et al. | 437/28 |
| 4,847,213 | 7/1989 | Pfiester | 437/57 |
| 4,891,326 | 1/1990 | Koyanagi | 437/40 |

FOREIGN PATENT DOCUMENTS 0114129  5/1988  Japan .................. 148/DIG. 105

Primary Examiner—Brian E. Hear
Assistant Examiner—Tuan Nguyen
Attorney, Agent, or Firm—John A. Fisher

[57] ABSTRACT

A process for fabricating semiconductor devices is disclosed which utilizes a selective deposition process to reduce the total number of process steps and especially the total number of photolithography steps required. In accordance with one embodiment of the invention a semiconductor substrate is provided having an insulating layer, a nucleating layer, and a second insulating layer overlaying the substrate. A photoresist mask is used an implant mask and as an etch mask to expose a portion of nucleating layer. A second implant mask is formed by the selective deposition of tungsten or other material on the exposed nucleating layer. The selectively deposited material is then used a mask for a second implantation.

3 Claims, 7 Drawing Sheets

SEMICONDUCTOR PROCESS USING SELECTIVE DEPOSITION

BACKGROUND OF THE INVENTION

This invention relates generally to the fabrication of semiconductor devices, and more particularly to a process for fabricating semiconductor devices which uses selective deposition of a masking layer to reduce the number of process steps.

The successful fabrication of semiconductor devices requires the sequential application of a large number of process steps. These many process steps are all carefully interrelated to accomplish the finished product and often require the structure resulting from one process step to be in alignment with the structure resulting from another process step. Reducing the total number of process steps results in a reduction of the cost of the process and may also increase the fabrication yield of that process. This is especially true of the reduction in photolithography steps and still more especially of those photolithography steps which are required to align one structure to another. For example, it is advantageous and cost effective to provide process steps which self align one structure to another, such as one ion implanted region to another ion implanted region.

Accordingly, there is a continuing need in the semiconductor industry for fabrication processes which reduce the number of required processing steps and which provide for self alignment between structures produced.

It is therefore an object of this invention to provide an improved process for fabricating semiconductor devices which reduces the number of process steps.

It is another object of this invention to provide an improved process for fabricating semiconductor devices with a reduced number of photolithography process steps.

It is yet another object of this invention to provide an improved process for fabricating semiconductor devices including the alignment of ion implanted regions.

It is still another object of this invention to provide an improved process for fabricating LDD CMOS devices.

It is a further object of this invention to provide an improved process for aligning device regions in a semiconductor structure while utilizing a reduced number of processing steps.

BRIEF SUMMARY OF THE INVENTION

The foregoing and other objects and advantages of the invention are achieved in accordance with a semiconductor fabrication process in which a selectively deposited masking layer is used as a process mask. In accordance with one specific embodiment of the invention, a semiconductor device is fabricated by providing a semiconductor substrate having an overlaying layer of insulating material. A nucleating layer is formed on that insulating layer and a second insulating layer is formed over the nucleating layer. A first photolithographically patterned mask is formed overlaying selected portions of the second insulating layer. The photolithographically defined masking element is used as an ion implantation mask for the implantation of first ions into the substrate and also as an etch mask for masking the selective removal of the second insulating layer. After removing the first masking element a second masking element is deposited by a process of selective deposition onto exposed portions of the nucleating layer. Because of the selective nature of the deposition process, this masking element is formed on the exposed portions of the nucleating layer without the need for an additional photolithographic alignment step. The second masking element, which can be, for example, selectively deposited tungsten, is used as an ion implantation mask to mask the implantation of second ions into the substrate. The second masking element is then removed and the processing continues in conventional manner.

DETAILED DESCRIPTION OF PREFERRED EMBODIMENTS

Semiconductor devices are fabricated, in accordance with the invention, by using a masking element formed by selective deposition as a process mask as is illustrated in the following illustrative embodiments. Selective deposition is a chemical vapor deposition in which the deposition conditions are adjusted, in known manner, so that the material being deposited deposits only on a prepared nucleating surface. For example, polycrystalline silicon, tungsten, copper, aluminum, and other materials can each be deposited selectively by the process of selective deposition. Silicon can be used a nucleating layer for the selective deposition of polycrystalline silicon or tungsten. Tungsten can be used as a nucleating layer for the selective deposition of tungsten or copper. Aluminum can be used as a nucleating layer for the selective deposition of aluminum. By providing a patterned nucleating layer or a patterned exposed portion of a nucleating layer, the selectively deposited material can be deposited in a desired location. The selectively deposited material is not deposited in those locations in which there is no exposed nucleating layer. The process of selective deposition is used, in accordance with the invention, as in integral part of a semiconductor device manufacturing process in which the property of selective deposition is used to reduce the number of photolithography steps needed.

Figure 1:
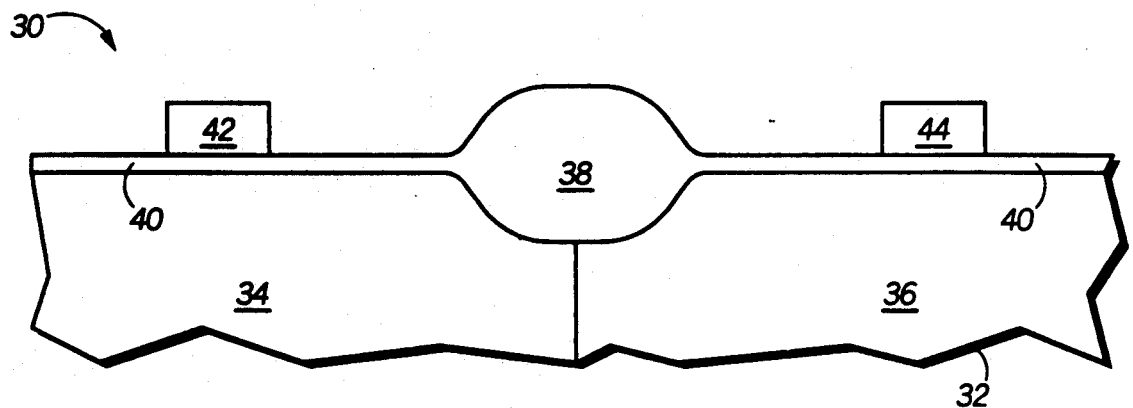
FIGS. 1-10 illustrate schematically, in cross-section, process steps in accordance with one embodiment of the invention.

FIGS. 1-10 schematically illustrate, in cross-section, process steps in accordance with one embodiment of the invention in which the process of selective deposition is employed in the fabrication of a LDD CMOS device. The illustrations show only that portion of the devices necessary to illustrate the invention; other portions of the devices are made by conventional process steps. FIG. 1 illustrates the initial structure of a device 30 in which the initial processing steps have been completed in conventional manner. Device 30 includes a semiconductor substrate 32 having a P-type surface region 34 in which an N channel MOS transistor will be fabricated and an N-type surface region 36 in which a P channel MOS transistor will be fabricated. The two surface regions are isolated at the surface of substrate 32 by a thick field oxide 38. A gate insulator 40 overlays the surface of both regions 34 and 36. Polycrystalline silicon gate electrodes 42 and 44 are patterned to overlay surface regions 34 and 36, respectively.

Figure 2:
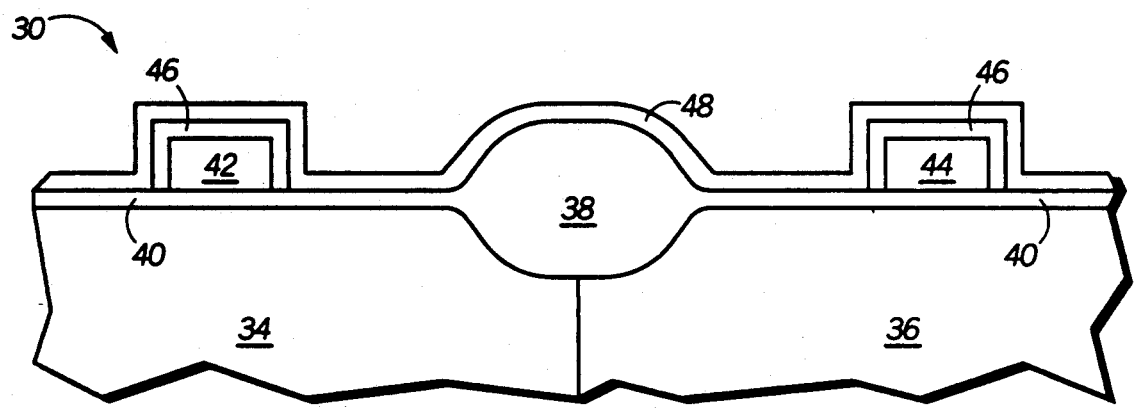

The process in accordance with the invention continues as illustrated in FIG. 2 by oxidizing gate electrodes 42 and 44 to form a thin layer of silicon dioxide 46 overlaying those electrodes. This oxidation step also serves to repair any damage that may have occurred to gate insulator 40 during the patterning of the gate electrodes. Silicon dioxide layer 46 has a thickness of about 1014 25 nanometers. A nucleating layer 48, which will later serve in the process as a nucleating layer for the selective deposition of a masking element, is then deposited over the structure. Nucleating layer 48 can be polycrystalline silicon deposited by chemical vapor deposition (CVD), silicon deposited by sputtering, or other material which will provide the nucleating function for the selective deposition. The particular material chosen for the nucleating layer is at least partially dependent upon the material chosen for the selective deposition.

Figure 3:
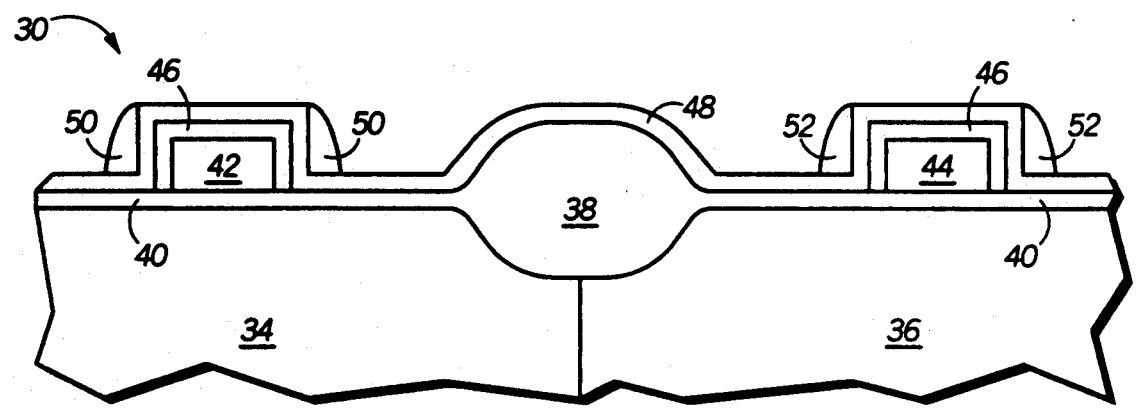

Sidewall spacers 50 and 52 are formed at the edges of gate electrodes 42 and 44, respectively, as illustrated in FIG. 3. The sidewall spacers are formed, for example, by the deposition of a layer of low temperature oxide (LTO) and the subsequent anisotropic etch of that layer. Preferably the LTO layer is etched using reactive ion etching. Because of the directional nature of the anisotropic etching, portions of the LTO remain as spacers at the edges of the gate electrodes.

Figure 4:
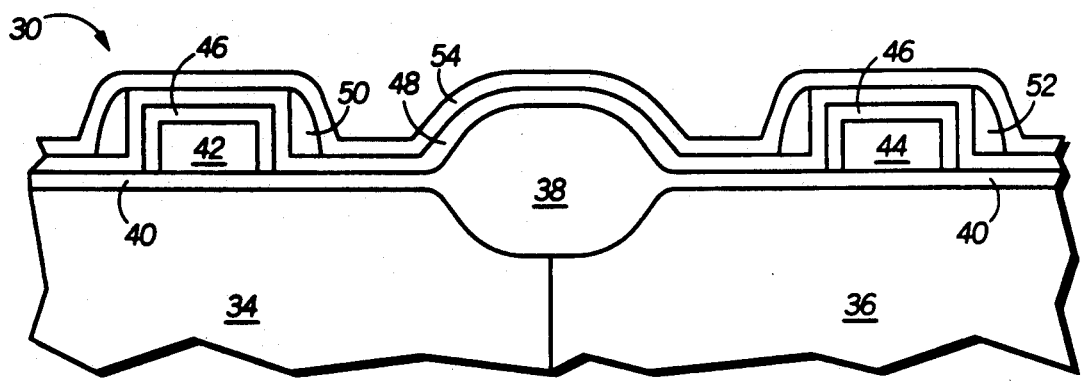

The process continues as illustrated in FIG. 4 by depositing a thin LTO layer 54 over the nucleating layer 48. Alternatively, if the nucleating layer is silicon, layer 54 can be formed by oxidizing the silicon layer. Oxide layer 54 is formed to a thickness of 10-15 nanometers. Other material, such as silicon nitride, which does not function as a nucleating site for the subsequently selectively deposited material can be used in place of the LTO or thermal oxide.

Figure 5:
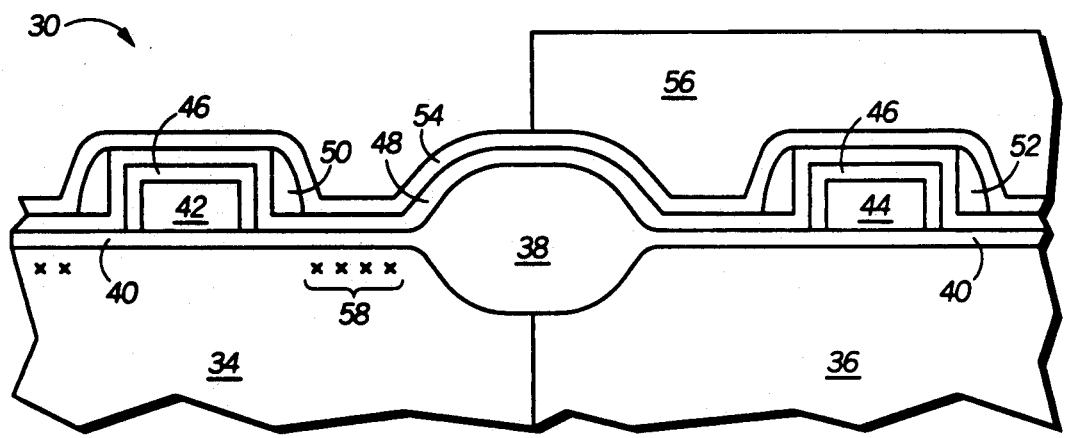

A masking layer 56 is next formed overlaying N-type surface region 36 as illustrated in FIG. 5. Masking layer 56 is preferably formed of photoresist which is patterned in conventional manner. Masking element 56 overlays and protects surface region 36 while leaving exposed or unprotected surface region 34 and the structure formed thereover. Device structure 30 is then ion implanted with N-type ions such as arsenic or phosphorus to form what will become the heavily doped portion of the source and drain regions of N-channel transistors. The location of the implanted N-type ion is indicated by the Xs 58. The implantation is masked by masking element 56 as well as by field oxide 38, gate electrode 42, and sidewall spacers 50. Because of the presence of sidewall spacers 50, implanted ions 58 are spaced apart from gate electrode 42.

Figure 6:
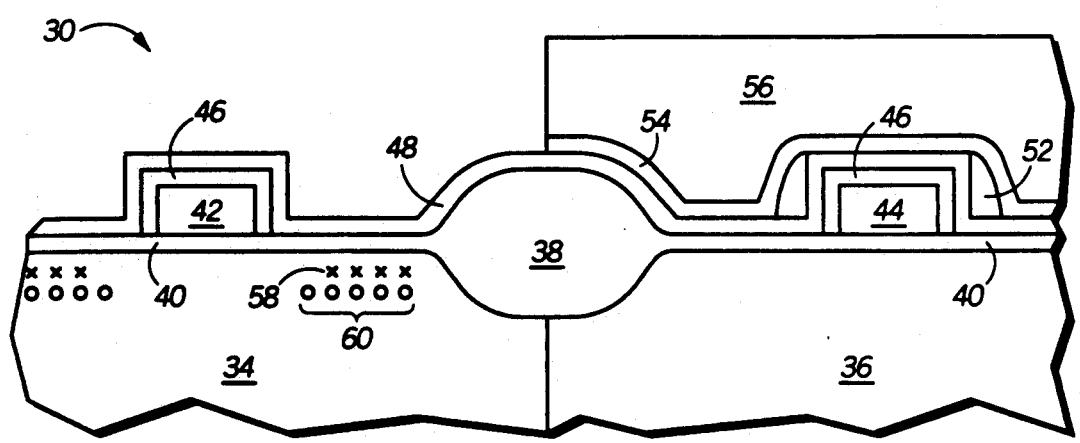

As illustrated in FIG. 6, masking element 56 is next used as an etch mask for the masked removal of that portion of oxide layer 54 which overlays P-type surface region 34. Sidewall spacers 50 are also removed at this time. The removal of oxide layer 54 and sidewall spacers 50 exposes that portion of nucleating layer 48 which overlays P-type surface region 34. After sidewall spacers 50 are removed, structure 30 is again ion implanted with ions of N-type impurity to form the lightly doped portion of what will become the source and drain regions of the N-type transistors. The location of the second implanted N-type impurities is indicated by the circles 60. The second ion implantation is conducted at an energy selected so that the ions are masked by and self-aligned with gate electrode 42, but pass through nucleating layer 48.

Figure 7:
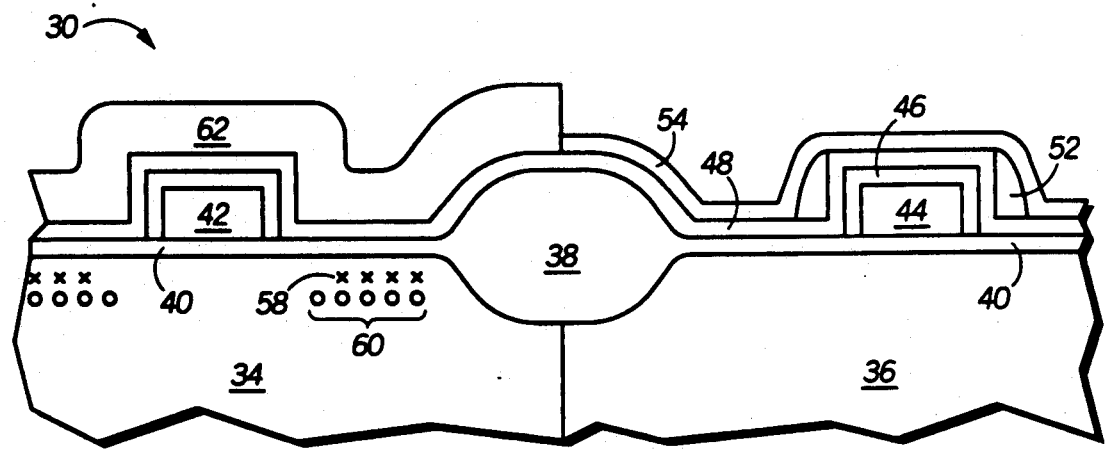

Masking element 56 is removed, and, in accordance with the invention, a second masking layer 62 is formed by selective deposition as illustrated in FIG. 7. Selectively deposited masking element 62, which is preferably tungsten, but could also be polycrystalline silicon, copper, aluminum, or the like, is deposited on the exposed portions of nucleating layer 48. None of the masking element forms over that portion of nucleating layer 48 which is covered by oxide layer 54. Masking element 62 thus forms over and protects surface region 34 but does not form over or mask surface region 36. The formation of selectively deposited masking layer 62 in selective locations is accomplished without a separate photolithographic masking operation.

Figure 8:
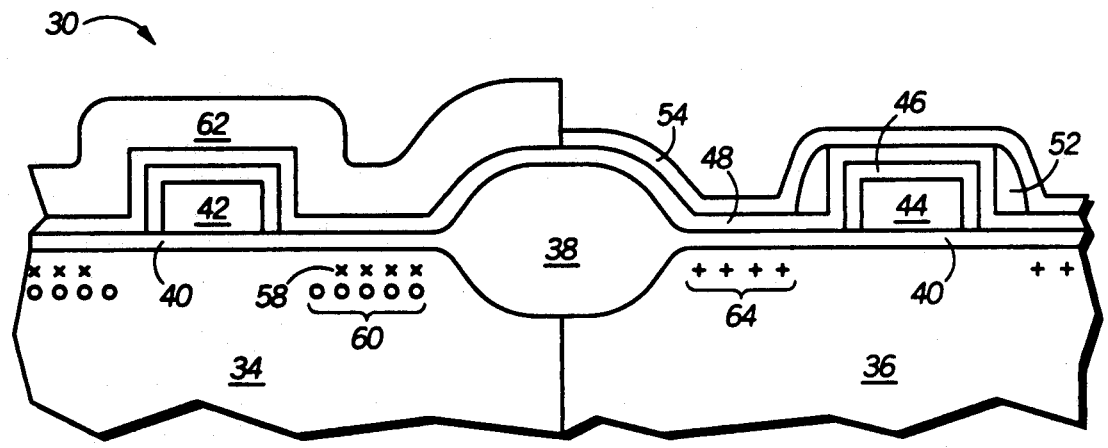

As illustrated in FIG. 8, the process continued by the ion implantation of P-type dopant ions into device structure 30 as illustrated by the plus signs 64. These P-type implanted ions are masked by a masking element 62, field oxide 38, gate electrode 44, and sidewall spacers 52. This ion implanted material will eventually form the heavily doped portion of source and drain regions for P-channel transistors. Implanted ions 64 are spaced apart from gate electrode 44 by the width of sidewall spacer 52.

Figure 9:
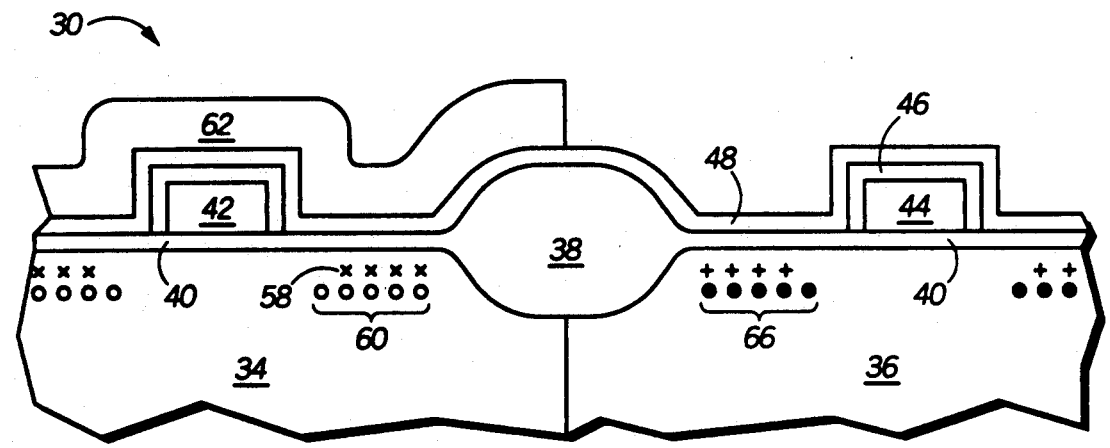

The remaining portion of oxide layer 54 and sidewall spacers 52 are removed as illustrated in FIG. 9 using selectively deposited masking element 62 as an etch mask. Additional P-type impurities are implanted into structure 30 using selectively deposited masking element 62, field oxide 38, and gate electrode 44 as an implant mask. The second P-type implant, indicated by the solid dots 66, forms the lightly doped portion of the P-type source and drain regions and is self-aligned with gate electrode 44.

Figure 10:
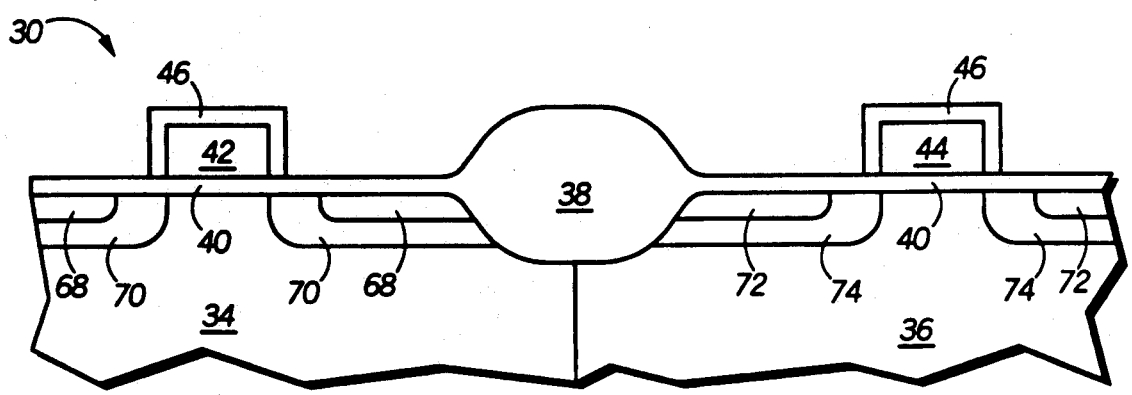

Masking element 62 and nucleating layer 48 are then removed and processing continues in the normal manner. If the nucleating layer 48 is silicon, that layer can be removed by etching or by subjecting the layer to an oxidizing ambient so that the layer is converted to silicon dioxide. The continued processing includes heating structure 30 to anneal and activate the implanted ions. After activation, as illustrated in FIG. 10, the two N type ion implantations result in the formation of source and drain regions of N channel transistors having a heavily doped portion 68 and a lightly doped portion 70. The two P type ion implantations result in source and drain regions of P channel transistors having a heavily doped portion 72 and a lightly doped portion 74. The remaining steps in the process, which are well known, include, for example, the formation of additional insulating layers, the etching of vias through these insulating layers, and the formation and patterning of contact and interconnect metallization. These steps, which are well known, have not been shown.

Semiconductor device 30, as illustrated in FIG. 10 includes N channel transistors and P channel transistors, each having precisely aligned LDD source and drain structures. The LDD structures on both N channel and P channel devices have been implemented using only one photolithography step, that used to form the initial masking element 56.

More generally, the process illustrated in FIGS. 1-10 provides for the self alignment of process steps in two areas of the substrate using only one photolithography step. In the illustrative example, the process steps are ion implantations. As another, more straight forward application of the invention (not specifically illustrated, but applying the same principle), a substrate is prepared having an overlaying layer of nucleating material. The nucleating material, in turn is overlaid by a layer of LTO or other masking material which is patterned as needed for the circuit being implemented so that one portion of the nucleating material is exposed and the remainder is protected by the LTO. The portion of the substrate which does not underlie the remaining LTO is implanted with conductivity determining ions. The exposed nucleating material is used to nucleate the selective deposition of a masking element. The selectively deposited masking element is used as an ion implantation mask for the implantation of additional conductivity determining impurities which are self aligned with the first implanted ions. This straight forward process is especially useful, for example, for the self aligned implantation of ions for the formation of retrograded P- and N-type wells in the substrate.

Figure 11:
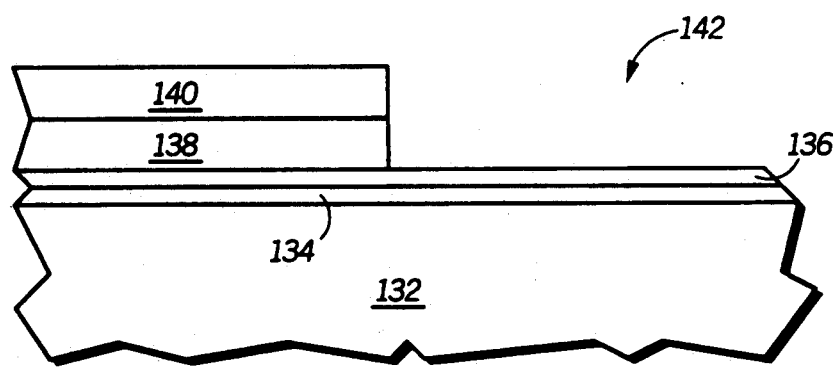
FIGS. 11-13 illustrate schematically, in cross-section, process steps in accordance with a further embodiment of the invention.
Figure 12:
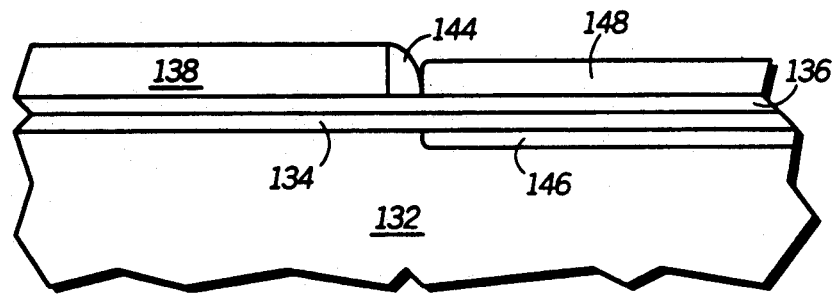
Figure 13:
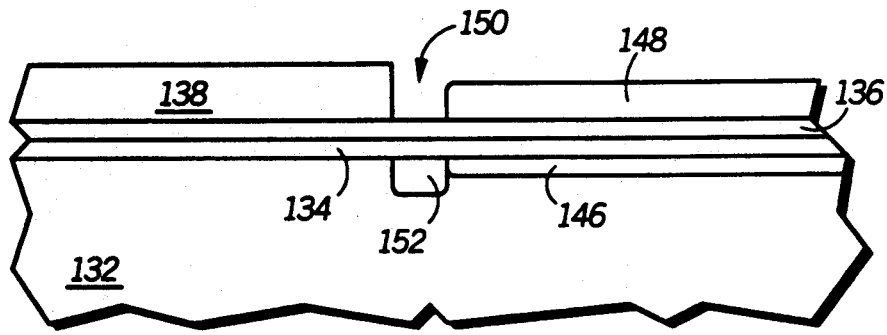

FIGS. 11-13 illustrate a further embodiment of the invention in which, by using a disposable sidewall spacer, three process steps, such as ion implantation steps, are self aligned using only one photolithography step. As illustrated in FIG. 11, a substrate 132 is provided having overlaying layers of silicon dioxide 134 and a material 136 such as polycrystalline silicon which is capable of nucleating selective deposition. Polycrystalline silicon layer 136 is, inturn, covered by a protective layer 138, such as a low temperature deposited oxide or other material which is not capable of nucleating selective deposition. Protective layer 138 is patterned with photoresist 140 in conventional photolithography process to expose a first portion 142 of a polycrystalline silicon layer 136.

As illustrated in FIG. 12, sidewall spacer 144 is formed at the edge of protective layer 138. The sidewall spacer is formed of a material such as silicon nitride which is differentially etchable with respect to protective layer 138. Using the sidewall spacer 144 and protective layer 138 as ion implantation masks, first ions are implanted into substrate 132 to form a first implanted region 146. A masking element 148 is then formed by the process of selective deposition using the exposed portion of layer 136 as a nucleating site for the selective deposition. The masking element can be formed, for example, of polycrystalline silicon.

The sidewall spacer 144 is then removed by etching to expose a region 150 adjacent masking element 148. A second ion implantation is then performed using masking element 148 and protective layer 138 as implant masks to form region 152 in substrate 132 as illustrated in FIG. 13. After removing the remaining portion of protective layer 138, the substrate is implanted a third time to form a third ion implanted region (not shown) overlapping region 152. Three implanted regions are thus formed in self alignment using only one photolithography step. The process as illustrated in FIGS. 11-13 can be used, for example for providing self aligned field implants. The first ion implant can be phosphorous to form the channel stops in the N-well of a CMOS structure. The second ion implant is a high dose boron implant to increase the field threshold voltage at the edge of the P-well. And finally, the third ion implant is a moderate dose, low energy implant of boron to form the conventional boron channel stop implant. The third implant is thus rimmed by the heavy second implant and both are aligned with the first implant which is of opposite conductivity type.

FIGS. 14-20 illustrate a further process embodiment in accordance with the invention. Again, the figures illustrate only a small portion of a semiconductor device.

Figure 14:
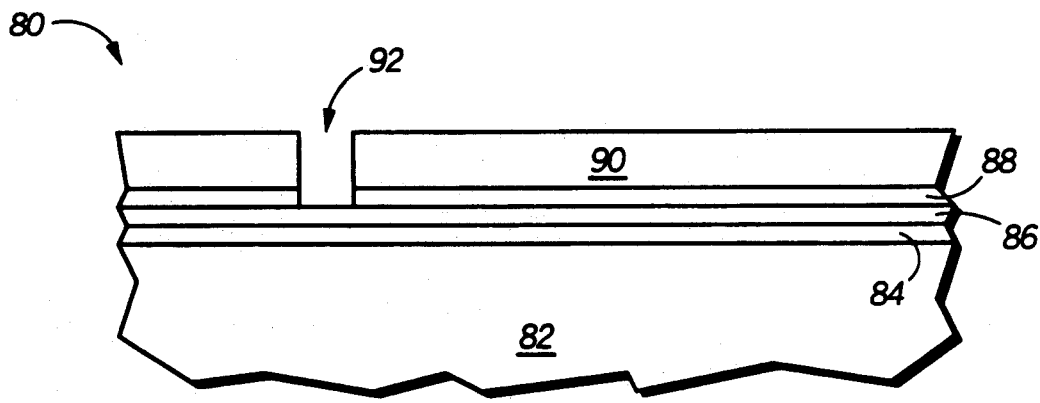
FIGS. 14-20 illustrate schematically, in cross-section, process steps in accordance with a still further embodiment of the invention.

FIG. 14 illustrates, in cross-section, a portion of a semiconductor device structure 80 at an early stage in its fabrication. Device structure 80 includes a semiconductor substrate 82 such as a monocrystalline silicon substrate. Overlaying substrate 82 is an insulating layer 84 and nucleating layer 86. Nucleating layer 86 is selected from those materials such as silicon, tungsten, aluminum, and the like which function to nucleate the selective deposition of a chemically vapor deposited material. A masking material 88 is formed overlaying nucleating layer 86. In turn, a photoresist mask 90 is formed and patterned overlaying masking layer 88. In conventional manner the photoresist mask 90 is used to pattern masking layer 88. For example, masking layer 88 can be a thin layer of low temperature chemical vapor deposited oxide having a thickness of 100-500 nanometers. A photolithographic patterning and etching step is used to etch an opening 92 through masking layer 88 to expose a portion of the underlying nucleating layer 86.

Figure 15:
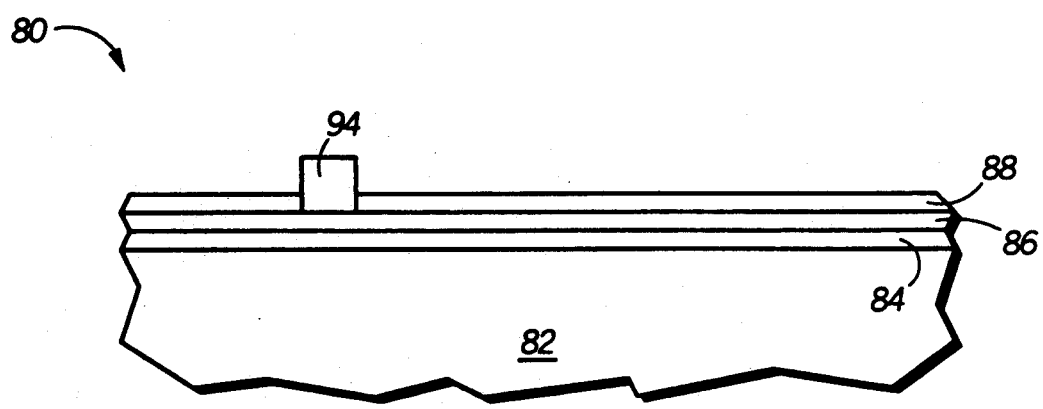

Photoresist mask 90 is removed and a masking element 94 is formed by selective deposition of a material such as tungsten, silicon, copper, or aluminum, on that portion of nucleating layer 86 which is exposed by the opening 92 through masking layer 88. As is illustrated in FIG. 15, by the nature of the selective deposition process, masking element 94 deposits only where the nucleating layer is exposed and no deposition takes place on masking layer 88.

Figure 16:
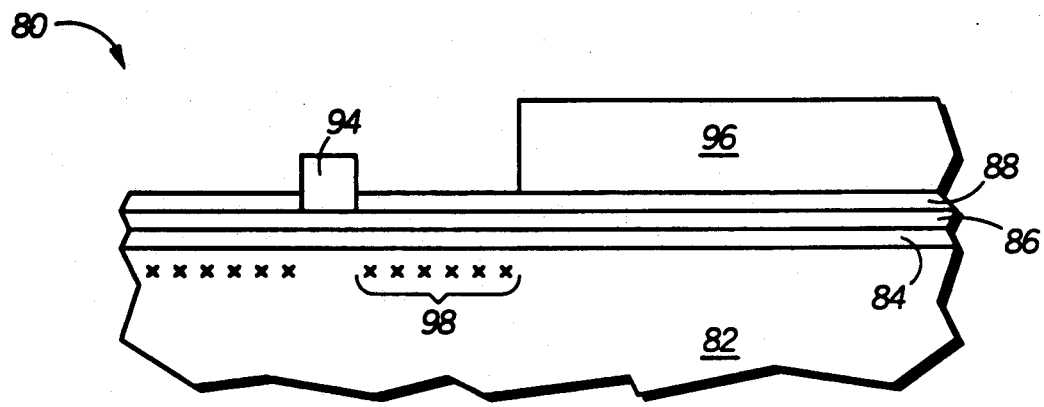
Figure 17:
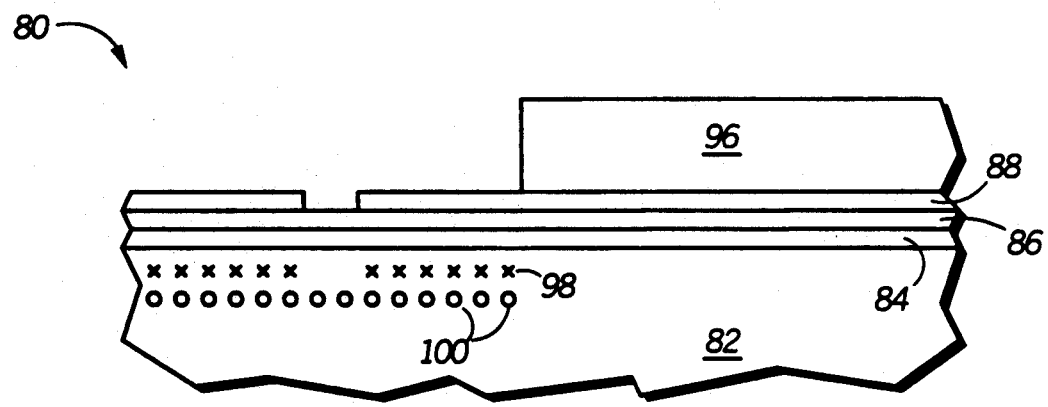

Using a second photolithographic masking operation, an additional photoresist mask 96 is patterning covering a second portion of masking layer 88 and overlaying a second portion of substrate 82. With photoresist mask 96 and selectively deposited masking element 94 in place, substrate 82 is ion implanted with first conductivity determining ions. The location of these ions in substrate 82 is indicated by Xs 98 as illustrated in FIG. 16.

Selectively deposited masking element 94 is removed and substrate 82 is again implanted with conductivity determining ions using photoresist mask 96 as an implantation mask. The location of the implant ions is indicated by the open circles 100 illustrated in FIG. 17.

Figure 18:
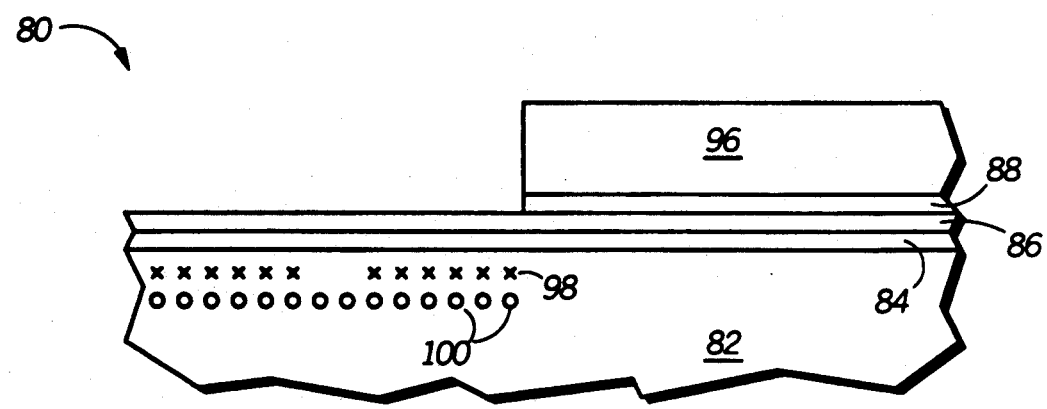
Figure 19:
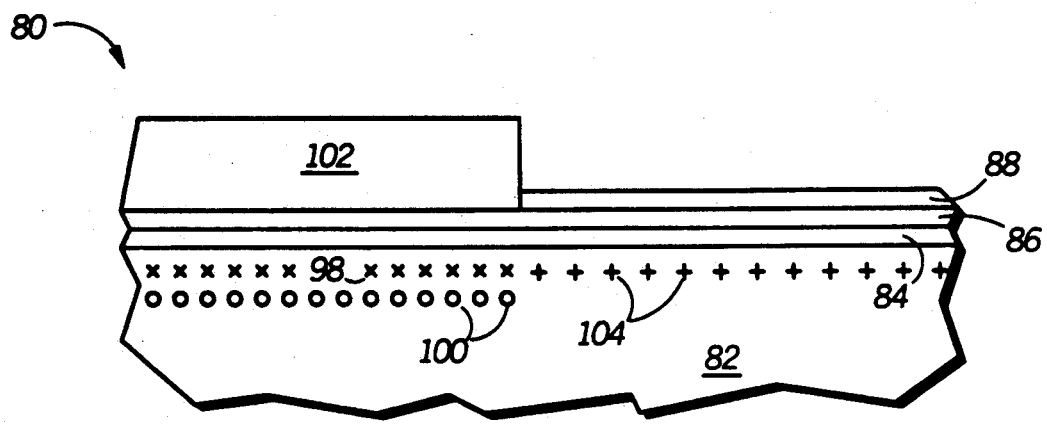

Using photoresist mask 96 as an etch mask, the exposed portion of masking layer 88 is removed. This exposes an additional portion of nucleating layer 86 as illustrated in FIG. 18.

Photoresist mask 96 is removed and a second selectively deposited masking layer 102 is selectively deposited by chemical vapor deposition onto the exposed portion of nucleating layer 86. Again, selectively deposited masking element 102 can be formed from those materials which are selectively depositable such as silicon, tungsten, copper, aluminum, or the like. None of the selectively deposited material deposits overlaying masking layer 88 so that the portion of substrate 82 which underlays masking layer 88 is not overlaid or protected by selectively deposited masking element 102. As illustrated in FIG. 19, substrate 82 is again implanted with conductivity determining ion using masking element 102 as an implantation mask. The resulting location of the ions so implanted is indicated by plus signs 104.

Figure 20:
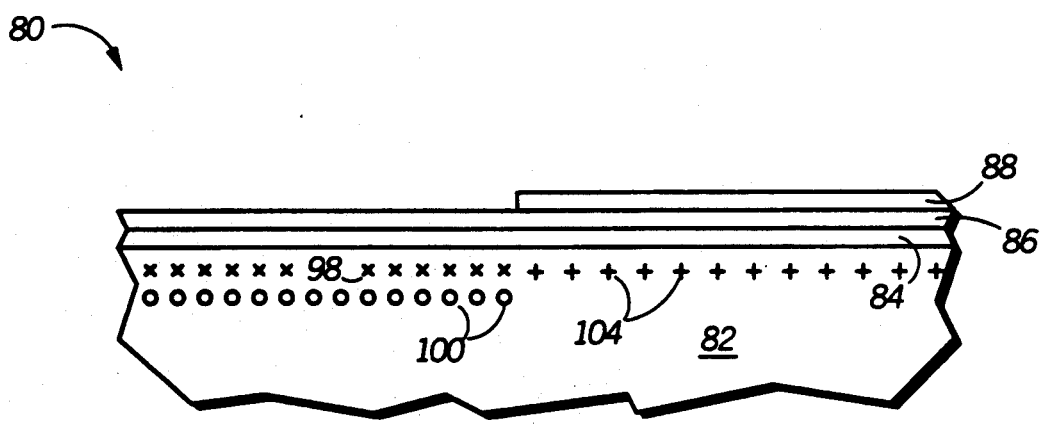

As illustrated in FIG. 20, the selectively deposited masking element 102 is then removed and device structure 80 is ready for further conventional processing. Although not shown, the further processing may include the removal of the remaining portion of masking element 88 and nucleating layer 86. Subsequent steps may also include the formation of contact regions, interconnect metallization, and the like.

The process illustrated in FIGS. 14-20 can be used, for example, to form the precisely doped channel regions of N channel transistors (implant two), P channel transistors (implant three), and punchthrough barriers at the edges of the channel of the N channel transistor (implant one).

Thus it is apparent that there has been provided, in accordance with the invention, a semiconductor device fabrication process which full meets the objects and advantages set forth above. Although the invention has been described and illustrated with reference to specific embodiments thereof, it is not intended that the invention be limited to these illustrative embodiments. Those skilled in the art will recognize that variations and modifications are possible without departing from the spirit of the invention. For example, the above invention can be implemented on a semiconductor substrate which is preferably silicon but which may also be other semiconductive materials such as gallium arsenide or one of the other III-V or II-VI compounds. The process may be used in a CMOS process or in a single channel process. CMOS structures may be N-well, P-well, or twin well. Although a LOCOS type field oxide isolation has been illustrated, the process may be implemented with other isolation techniques. Further, other insulating and masking layers may be used such as other oxides, nitrides, and the like. Accordingly, it is intended to encompass within the invention all such variations and modifications as fall within the scope of the appended claims.

We claim:

1. A process for fabricating semiconductor devices comprising the steps of:
   providing a semiconductor substrate having first and second surface areas of first and second conductivity type and having an insulator layer formed thereover;
   forming first and second gate electrodes overlaying said first and second surface areas, respectively, and separated therefrom by said insulator layer;
   forming a second insulator layer overlaying said first and second gate electrodes;
   depositing a silicon layer overlaying said second insulator layer;
   forming sidewall spacers at the edges of said first and second gate electrodes and overlaying said silicon surface;
   forming a third insulator layer overlaying exposed portions of said silicon layer;
   forming a mask overlaying said second surface region and exposing a portion of said third insulator overlaying said first surface region;
   implanting ions of said second conductivity type into said first surface region using said first gate electrode, sidewall spacers, and mask as an implantation mask;
   removing said sidewall spacers and said third insulator layer overlaying said first region;
   implanting additional ions of said second conductivity type into said first surface region using said first gate electrode and said mask as an implantation mask;
   removing said mask;
   depositing a second masking material by selective deposition onto portions of said silicon layer not overlaid by said third insulator layer;
   implanting ions of said first conductivity type into said second surface region using said sidewall spacers, said second gate electrode and said second masking material as implantation masks;
   removing said third insulator and said sidewall spacers;
   implanting additional ions of said second conductivity type into said second surface region using said second gate electrode and said second masking material as an etch mask; removing said masking material; and
   removing said silicon layer.

2. The process of claim 1 wherein said step of removing said silicon layer comprises oxidizing said silicon layer.

3. The process of claim 1 wherein said step of depositing a second masking material by selective deposition comprises the step of selectively depositing a material selected from the group consisting of silicon, tungsten, copper, and aluminum.

* * * * *